United States Patent
Schinzel (10) Patent No.: US 10,255,155 B2
(45) Date of Patent: Apr. 9, 2019

(54) SCHEDULER

(71) Applicant: Advantest Corporation, Tokyo (JP)

(72) Inventor: Peter Schinzel, Gartringen (DE)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 15/495,899

(22) Filed: Apr. 24, 2017

(65) Prior Publication Data

US 2017/0228301 A1 Aug. 10, 2017

Related U.S. Application Data

(63) Continuation of application No. PCT/EP2014/073188, filed on Oct. 29, 2014.

(51) Int. Cl.
*G01R 31/28* (2006.01)
*G06F 11/273* (2006.01)
*G01R 31/317* (2006.01)
*G01R 31/319* (2006.01)

(52) U.S. Cl.
CPC .... *G06F 11/2733* (2013.01); *G01R 31/31724* (2013.01); *G01R 31/31903* (2013.01)

(58) Field of Classification Search
CPC .. G06F 11/2733; G06F 11/27; G06F 11/3688; G01R 31/31903; G01R 31/31724; G01R 31/2894; H04M 3/32; H04M 2201/14
See application file for complete search history.

(56) References Cited

U.S. PATENT DOCUMENTS

| | | | |
|---|---|---|---|
| 6,327,545 B1 | 12/2001 | Browen et al. | |
| 6,397,160 B1 | 5/2002 | Craig et al. | |
| 6,795,496 B1 | 9/2004 | Soma et al. | |
| 7,256,585 B1 | 8/2007 | Shoulders | |

(Continued)

FOREIGN PATENT DOCUMENTS

| | | |
|---|---|---|
| EP | 0626588 | 11/1994 |
| EP | 0984291 | 3/2000 |

(Continued)

OTHER PUBLICATIONS

Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.

(Continued)

*Primary Examiner* — Guerrier Merant (57) ABSTRACT

Embodiments provide a scheduler for scheduling test times of a plurality of tester software environments for an automatic test equipment. The scheduler is configured to automatically assign test times to the plurality of tester software environments, to acquire test instructions from a tester software environment of the plurality of tester software environments to which a current test time is assigned, to control the automatic test equipment to perform a test according to the test instructions in order to obtain test results, and to provide the test results to the tester software environment of the plurality of tester software environments to which the current test time is assigned.

11 Claims, 5 Drawing Sheets

(56) References Cited

U.S. PATENT DOCUMENTS

| | | | |
|---|---|---|---|
| 7,508,920 B1* | 3/2009 | Yu | H04M 3/32 379/10.01 |
| 8,191,071 B2 | 5/2012 | Noll et al. | |
| 8,260,602 B1 | 9/2012 | Hamon | |
| 8,464,224 B2 | 6/2013 | Dulip et al. | |
| 8,589,886 B2 | 11/2013 | Lavie et al. | |
| 2004/0004466 A1 | 1/2004 | Miyanaga et al. | |
| 2005/0050546 A1 | 3/2005 | Remany et al. | |
| 2005/0068068 A1 | 3/2005 | Hall | |
| 2005/0234662 A1 | 10/2005 | Niedzwiecki et al. | |
| 2009/0092177 A1 | 4/2009 | Dvorak et al. | |
| 2009/0129129 A1 | 5/2009 | Udagawa | |
| 2009/0272634 A1 | 11/2009 | Ehlers et al. | |
| 2010/0225301 A1 | 9/2010 | Nakayama et al. | |
| 2010/0228515 A1 | 9/2010 | Srinivasan et al. | |
| 2010/0309952 A1 | 12/2010 | Asami | |
| 2010/0312506 A1 | 12/2010 | Taylor | |
| 2011/0227767 A1 | 9/2011 | O'Brien | |
| 2011/0288808 A1* | 11/2011 | Fan | G01R 31/2894 702/118 |
| 2012/0049655 A1 | 3/2012 | Leyendecker et al. | |
| 2012/0221279 A1* | 8/2012 | Zhang | G06F 11/3688 702/108 |
| 2013/0006567 A1 | 1/2013 | Horn | |
| 2013/0229068 A1 | 9/2013 | Sanders, III et al. | |
| 2013/0234723 A1 | 9/2013 | Behrens et al. | |

FOREIGN PATENT DOCUMENTS

| | | |
|---|---|---|
| EP | 1298778 | 4/2003 |
| JP | H11038087 | 2/1999 |
| JP | 2000009792 | 1/2000 |
| WO | 99/21025 | 4/1999 |
| WO | 2012/084028 | 6/2012 |
| WO | 2014/135194 | 9/2014 |

OTHER PUBLICATIONS

Liu, Lei, "Finite Automata for Evaluating Testbed Resource Contention," IEEE, Wireless Telecommunications Symposium WTS 2007, Piscataway, NJ, Apr. 26, 2007, pp. 1-6.

Quintanel, S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.

Lenk, F., et al., "A New Multiport Measurement-Method Using a Two-Port Network Analyzer," IEEE MTT-S International Microwave Symposium, Jun. 12-17, 2005, pp. 1663-1666.

Kam, D.G., et al., "Multiport Measurement Method Using a Two-Port Network Analyzer With Remaining Ports Unterminated," IEEE Microwave and Wireless Components Letters, vol. 17, No. 9, Sep. 2007, pp. 694-696.

Chen, C.-J., et al., "An Error Analysis of the Scattering Matrix Renormalization Transform," IEEE Transactions on Microwave Theory and Techniques, vol. 57, No. 4, Apr. 2009, pp. 863-868.

Rolfes, I., et al., "Multiport Method for the Measurement of the Scattering Parameters of N-Ports," IEEE Transactions on Microwave Theory and Techniques, vol. 53, No. 6, Jun. 2005, pp. 1990-1996.

Sismanoglou, P., et al, "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.

White, H.E., "Printed English Compression by Dictionary Encoding," Proceedings of the IEEE, vol. 55, No. 3, Mar. 1967, pp. 390-396.

Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.

Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.

Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

* cited by examiner

SCHEDULER

CROSS-REFERENCE TO RELATED APPLICATIONS

This application is a continuation of copending International Application No. PCT/EP2014/073188, filed Oct. 29, 2014, which is incorporated herein by reference in its entirety.

Embodiments of the present invention relate to a scheduler for scheduling test times of a plurality of tester software environments for an automatic test equipment. Further embodiments relate to a method for scheduling test times of a plurality of tester software environments for an automatic test equipment. Some embodiments relate to a sequence control system that enables multiuser access to a tester.

BACKGROUND OF THE INVENTION

As the complexity of integrated circuits (IC) is increasing, the development of test programs needed to verify on an IC tester if the integrated circuits are functioning properly is a task that is performed by several test engineers in parallel. Each test engineer is developing some parts of the test program. When a test engineer has finished a part of the test program he needs to check if his part and the until then commonly developed test program is working as expected. To do so he needs the IC itself and an IC tester, which is executing the test program. Because IC testers are very expensive the test engineers share the IC tester to save costs, as will become clear from the discussion of FIG. 1.

Figure 1:
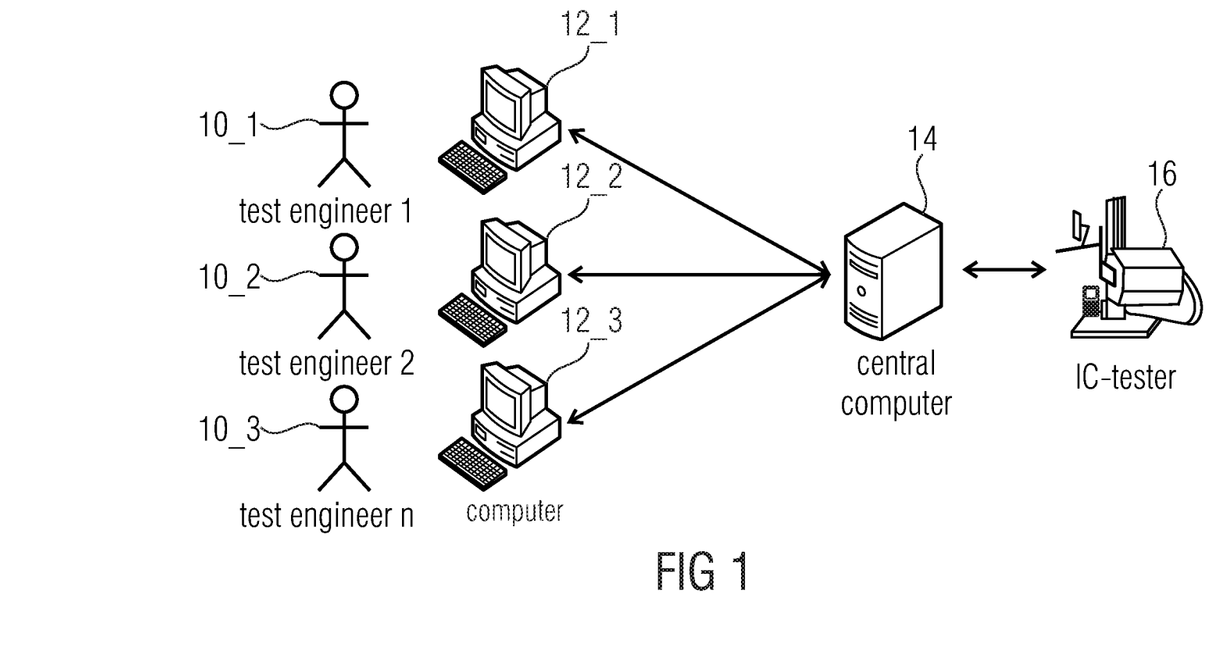
FIG. 1 shows a schematic block diagram of a typical setup for a multiuser access to a tester.

FIG. 1 shows a schematic block diagram of a typical setup for a multiuser access to an IC tester. Each software engineer 10_1 to 10_3 has his own computer 12_1 to 12_3 where he develops the part of the test program he is responsible for. Each computer 12_1 to 12_3 is connected to a central computer 14 which is connected to an IC tester (or automatic test equipment) 16. The central computer 14 controls the IC tester 16. To do this sharing there is some overhead associated to the engineers 10_1 to 10_3.

(1) The engineers need to coordinate test times between each other.
(2) Block the IC tester 16.
(3) Install the test program on the central computer 14.
(4) Check if the tester 16 is configured correctly and make corrections if needed.
(5) Execute the test.
(6) Get test results from the IC tester 16 to local computer for further data analysis.
(7) Reset the IC tester 16 in a pre-defined state.
(8) Release the IC tester 16.

This is time consuming and error-prone, as configuration changes on the IC tester and/or software environment made by a predecessor may be overlooked and lead to wrong measurement results.

SUMMARY

An embodiment may have a scheduler for scheduling test times of a plurality of tester software environments for an automatic test equipment, wherein the scheduler is configured to automatically assign test times to the plurality of tester software environments, to acquire test instructions from a tester software environment of the plurality of tester software environments to which a current test time is assigned, to control the automatic test equipment to perform a test according to the test instructions in order to obtain test results, and to provide the test results to the tester software environment of the plurality of tester software environments to which the current test time is assigned wherein the scheduler is further configured to set the automatic test equipment to an initial state before and/or after performing the test.

According to another embodiment, a system may have: an automatic test equipment; a central computer controlling the automatic test equipment, wherein an inventive scheduler is running on the central computer; and a plurality of computers, wherein the plurality of tester software environments are running on the plurality of computers.

According to another embodiment, a system may have: an automatic test equipment; a central computer controlling the automatic test equipment, wherein an inventive scheduler is running on the central computer, and wherein the plurality of tester software environments are running on the central computer as virtual machines or containers.

According to another embodiment, a method for scheduling test times of tester software environments for an automatic test equipment may have the steps of: automatically assigning test times to the plurality of tester software environments; acquiring test instructions from a tester software environment of the plurality of tester software environments to which a current test time is assigned; controlling the automatic test equipment to perform a test according to the test instructions in order to obtain test results; providing the test results to the tester software environment of the plurality of tester software environments to which the current test time is assigned setting the automatic test equipment to an initial state before and/or after performing the test.

Another embodiment may have a non-transitory digital storage medium having a computer program stored thereon to perform the method for scheduling test times of tester software environments for an automatic test equipment, the method having the steps of: automatically assigning test times to the plurality of tester software environments; acquiring test instructions from a tester software environment of the plurality of tester software environments to which a current test time is assigned; controlling the automatic test equipment to perform a test according to the test instructions in order to obtain test results; providing the test results to the tester software environment of the plurality of tester software environments to which the current test time is assigned setting the automatic test equipment to an initial state before and/or after performing the test, when said computer program is run by a computer.

Embodiments of the present invention provide a scheduler for scheduling test times of a plurality of tester software environments for an automatic test equipment. The scheduler is configured to automatically assign test times to the plurality of tester software environments, to acquire test instructions from a tester software environment of the plurality of tester software environments to which a current test time is assigned, to control the automatic test equipment to perform a test according to the test instructions in order to obtain test results, and to provide the test results to the tester software environment of the plurality of tester software environments to which the current test time is assigned.

According to the concept of the present invention, a simplified access to an automatic test equipment and reliable measurement results can be achieved by a scheduler. The scheduler automatically assigns test times to the plurality of tester software environments, for example, in response to a request for a test time. Further, the scheduler acquires the corresponding test instructions, such as a test programs and a tester configuration, and controls the automatic test equipment to perform the corresponding test. After performing the test the scheduler provides the test results to the corresponding tester software environment and optionally sets the automatic test equipment to a predefined state, such that a subsequent test provides reliable test results.

Further embodiments provide a method for scheduling test times of a plurality of tester software environments for an automatic test equipment. The method comprises automatically assigning test times to the plurality of tester software environments, acquiring test instructions from a tester software environment of the plurality of tester software environments to which a current test time is assigned, controlling the automatic test equipment to perform a test according to the test instructions in order to obtain test results, and providing the test results to the tester software environment of the plurality of tester software environments to which the current test time is assigned.

BRIEF DESCRIPTION OF THE DRAWINGS

Embodiments of the present invention will be detailed subsequently referring to the appended drawings, in which.

DETAILED DESCRIPTION OF THE INVENTION

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Figure 2:
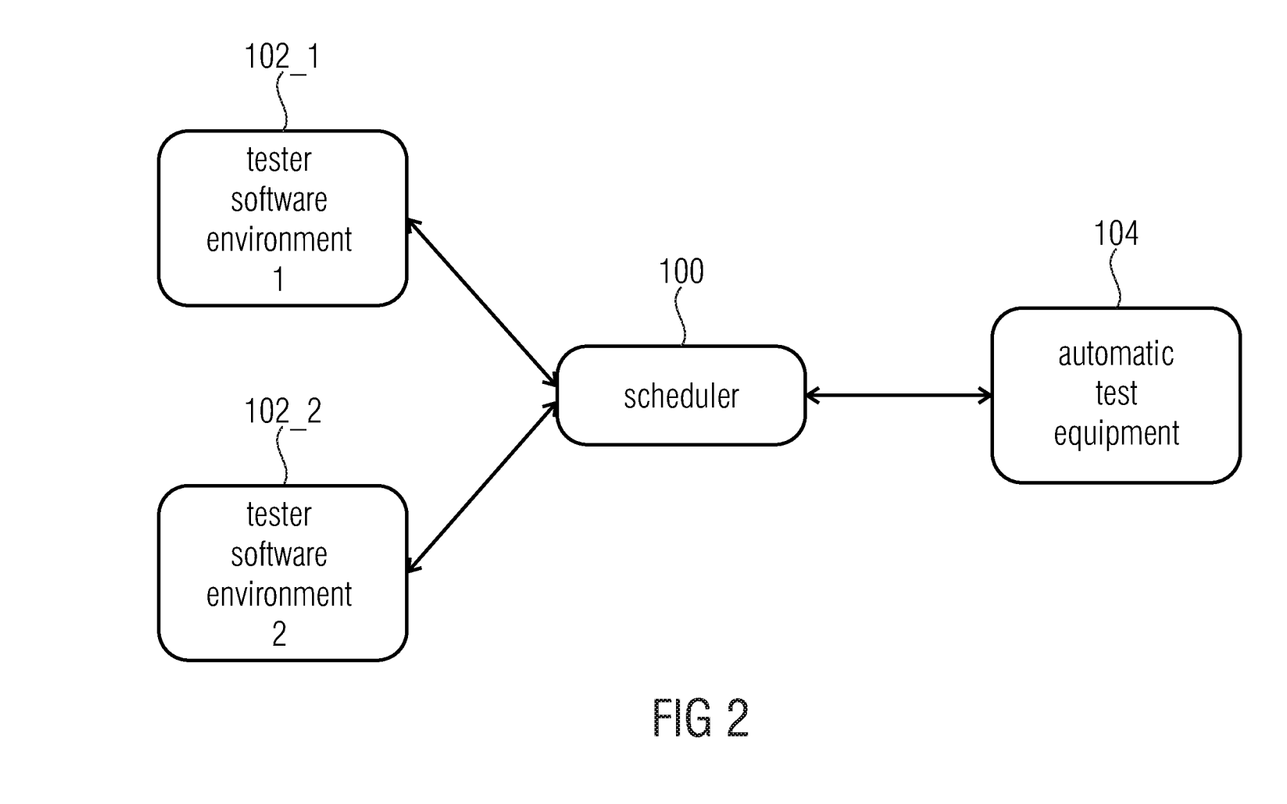
FIG. 2 shows a schematic block diagram of a scheduler for scheduling test times of a plurality of tester software environments for an automatic test equipment, according to an embodiment of the present invention.

FIG. 2 shows a schematic block diagram of a scheduler 100 for scheduling test times of a plurality of tester software environments 102_1 to 102_$n$ (n=2) for an automatic test equipment 104. The scheduler 100 is configured to automatically assign test times to the plurality of tester software environments 102_1 to 102_$n$ (n=2), to acquire test instructions (e.g., a tester program and/or tester configuration) from a tester software environment of the plurality of tester software environments 102_1 to 102_$n$ (n=2) to which a current test time is assigned (e.g. the first tester software environment 102_1, to control the automatic test equipment 104 to perform a test according to the test instructions in order to obtain test results, and to provide the test results to the tester software environment of the plurality of tests of software environments 102_1 to 102_$n$ to which the current test time is assigned.

In embodiments, after performing the test of the tester software environment to which the current test time is assigned (e.g. the first tester software environment 102_1), the scheduler 100 may acquire test instructions from a tester software environment of the plurality of tester software environments 102_1 to 102_$n$ (n=2) to which a subsequent test time is assigned (e.g. the second tester software environment 102_2) and to control the automatic test equipment to perform a test according to the test instructions in order to obtain test results, and to provide the test results to the tester software environment of the plurality of tester software environments 102_1 to 102_$n$ (n=2) to which the subsequent test time is assigned (e.g. the second tester software environment 102_2).

Note that although in FIG. 2 two tester software environments are shown, the scheduler 100 can be configured to schedule test times of up to n tester software environments 102_1 to 102_$n$ for an automatic test equipment 104, wherein n is a natural number equal to or greater than one, n≥1. In some embodiments n is a natural number equal to or greater than two, n≥2.

Embodiments overcome the overhead described in the introduction of the present patent application and will lead to more reliable measurement results.

Further, embodiments provide an automatic sequence flow. For the test engineers this scenario will look very similar to a scenario where each test engineer has its own IC tester 104, except when two or more test engineers want to run a test program on the IC tester 104 at the same time.

Figure 3:
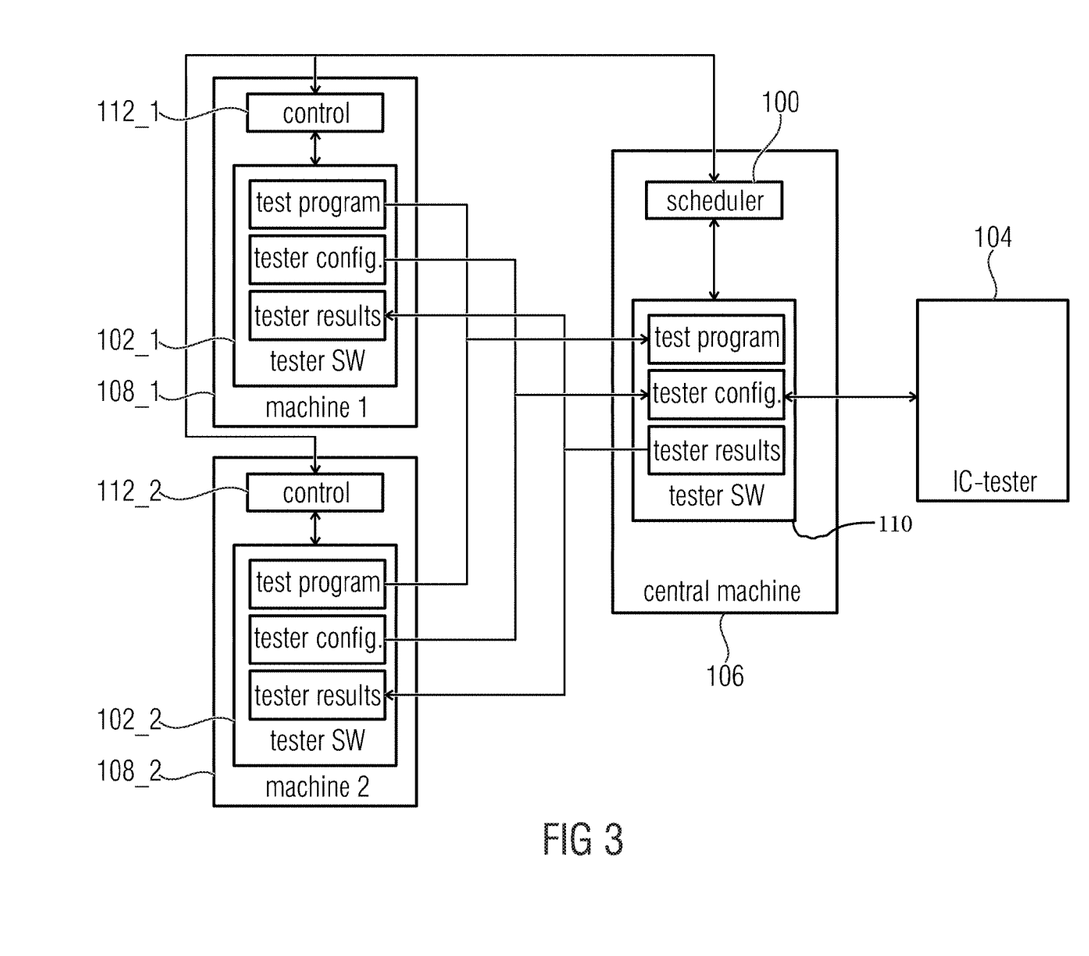
FIG. 3 shows a schematic block diagram of a scheduler for scheduling test times of a plurality of tester software environments for an automatic test equipment, according to a further embodiment of the present invention.

FIG. 3 shows a schematic block diagram of a scheduler 100 for scheduling test times of the plurality of tester software environments 102_1 to 102_$n$ (n=2) for an automatic test equipment 104. As shown in FIG. 3, the scheduler 100 may be implemented on a central computer (or central machine) 106 controlling the automatic test equipment 104. Further, the plurality of tester software environments 102_1 to 102_$n$ (n=2) may run on a plurality of computers 108_1 to 108_$n$ (n=2) connected to the central computer 106.

In embodiments, on the central computer 106 also a tester software environment 110 may run, wherein the scheduler 100 may be configured to control the tester software environment 110 running on (or executed on) the central computer 106.

In embodiments, the same tester software environment may run on the plurality of computers 108_1 to 108_$n$ (n=2) and on the central computer 106.

In embodiments the scheduler 100 may be configured to control the tester software environment 110 running on the central computer 106 to acquire the test instructions, such as the test program and the tester configuration, from the tester software environment of the plurality of tester software environments 102_1 to 102_$n$ (n=2) to which the current test time is assigned, to control the tester software environment 110 running on the central computer 106 to control the automatic test equipment 104 to perform the test according to the test instructions in order to obtain the test results, and to control the tester software environment 110 running on the central computer 106 to provide the test results to the tester software environment of the plurality of tester software environments 102_1 to 102_n to which the current test time is assigned.

In other words, FIG. 3 shows a block diagram of the sequence control system. In the block diagram a setup for two test engineers is illustrated, but the setup can be easily extended for several software engineers.

Each test engineer has its own computer (or machine) 108_1 to 108_n (n=2) where the tester software 102_1 to 102_n (n=2) is installed. Each computer (or machine) 108_1 to 108_n (n=2) contains the complete setup/configuration of the IC tester 104, the test program and the last results of the executed test of the test engineer.

When a test program should be executed, a message is sent to the scheduler 100. This can be done by a small program installed on the test engineer's computer (or machine) 108_1 to 108_n (n=2), e.g. the control unit or block 112_1 to 112_n (n=2) in FIG. 3.

The scheduler 100 will check if another test program is being executed. If another test program is being executed, the test engineer will be notified that the tester 104 is busy and the test-program execution will be delayed until the tester 104 is freed up. If several requests come in parallel, they will be executed in the order first received, first executed. The scheduler 100 will start the test program execution once the tester 104 is freed up. If the tester 104 is idle at the time the request comes in, the execution will be started immediately.

The test execution contains the following steps:
(1) Tester configuration and test program are copied and installed on the central machine 106.
(2) The test program is executed.
(3) The scheduler 100 is notified that the test program is executed.
(4) All test results and log files are copied to the machine of the test-engineer.
(5) The test engineer is notified that the test program was executed and the results are available.

This setup can be extended by using more than one IC tester 104 to increase the test capacity. In this case the scheduler 100 would transfer the tester configuration and test program to the next available tester. All following steps would stay the same. Embodiments could also be used to control a complete test-cell (IC tester 104 and handler or prober) to execute test-runs with a large number of chips.

Figure 4:
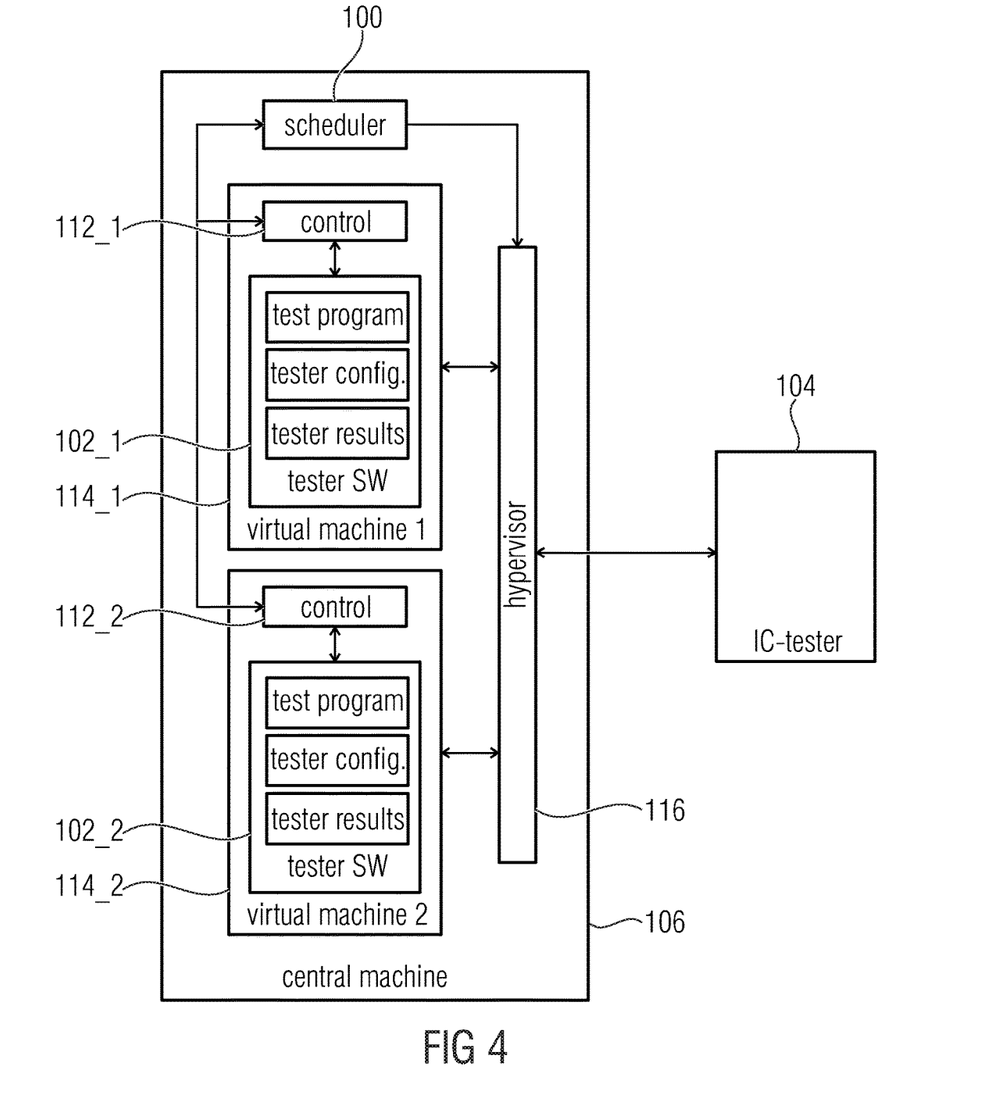
FIG. 4 shows a schematic block diagram of a scheduler for scheduling test times of a plurality of tester software environments for an automatic test equipment, according to a further embodiment of the present invention.

By using virtualization technology, the test engineers' machines can run on the central machine 106 as virtual machines or containers, as will become clear from the discussion of FIG. 4.

FIG. 4 shows a schematic block diagram of a scheduler 100 for scheduling test times of a plurality of tester software environments 102_1 to 102_n (n=2) for an automatic test equipment 104. As shown in FIG. 4, the plurality of tester software environments 102_1 to 102_n (n=2) can run on the central computer 106 as virtual machines or containers 114_1 to 114_n (n=2). In embodiments, a hypervisor 116 on the central computer (or central machine) 106 may control the access to the tester 104. Only one virtual machine or container at a time may have access to the tester 104. The test engineers have access to the virtual machines or container 114_1 to 114_n (n=2) in parallel. Access can be provided by a terminal or another computer. The advantage of this solution is that the machines of the test engineers are all running on the central computer (or central machine) 106 and the tester program, configuration and test results do not need to be copied to and from the central computer (or central machine) 106 to the test engineers' computers and vice versa. Therefore, the switching time between different test engineers can be significantly reduced. The control sequence is now the following.

When a test program should be executed, a message is sent to the scheduler 100. The scheduler 100 will check if another test program is being executed. If another test program is being executed, the test engineer will be notified that the tester 104 is busy and the program will be executed once the tester 104 is freed up. The scheduler 100 will start the test program execution once the tester 104 is freed up. If the tester 104 is idle at the time the request comes in, the execution will be started immediately.

The test execution is structured in the following way:
(1) The test engineer's virtual machine or container will be connected to the IC tester 104.
(2) Tester configuration and test program are send to the IC-Tester 104.
(3) The test program is executed.
(4) Test results and log files are send to the virtual machine or container.

Figure 5:
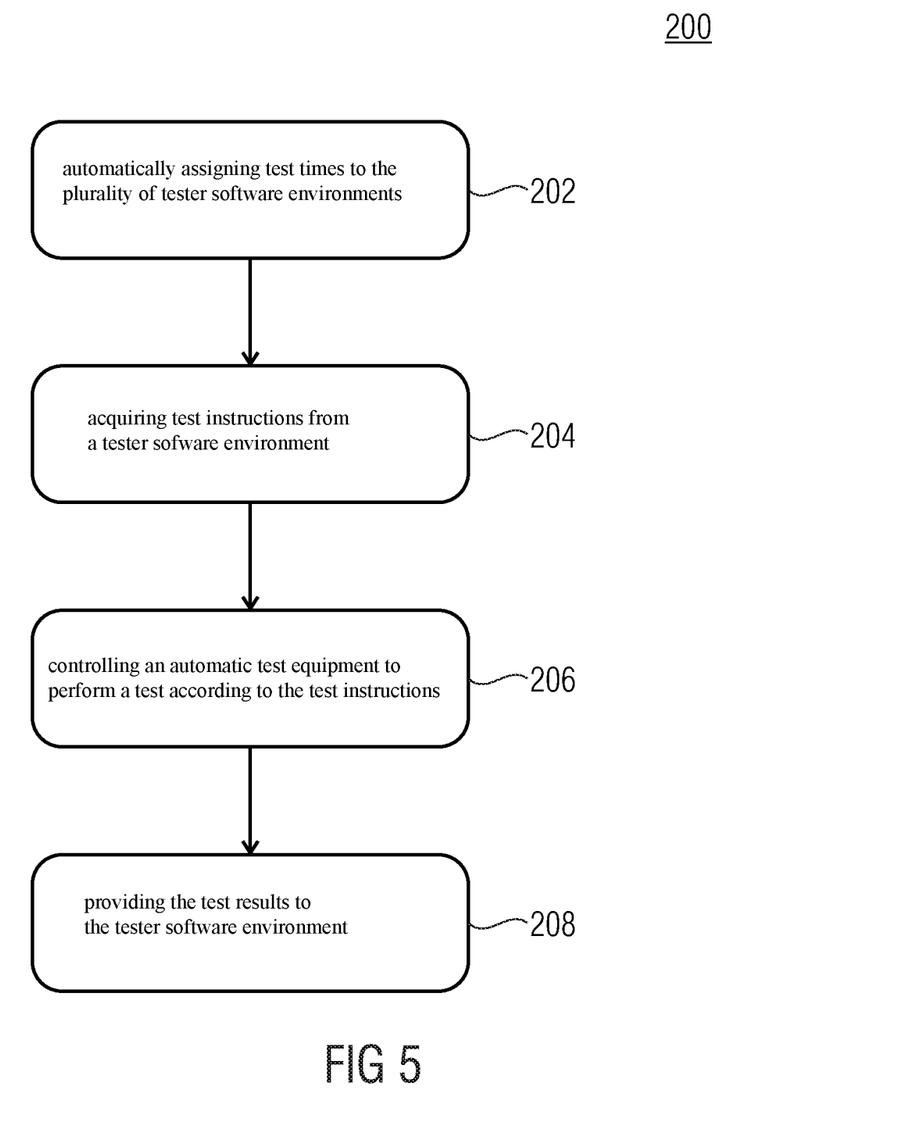
FIG. 5 shows a flowchart of a method for scheduling test times of a plurality of tester software environments for an automatic test equipment, according to an embodiment of the present invention.

FIG. 5 shows a flowchart of a method 200 for scheduling test times of tester software environments for an automatic test equipment. The method comprises a step 202 of automatically assigning test times to the plurality of tester software environments, a step 204 of acquiring test instructions from a tester software environment of the plurality of tester software environments to which a current test time is assigned, a step 206 of controlling the automatic test equipment to perform a test according to the test instructions in order to obtain test results, and a step 208 of providing the test results to the tester software environment of the plurality of tester software environments to which the current test time is assigned.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An apparatus comprising:
   a scheduler operable to schedule test times on an automatic test equipment for a plurality of tester software environments, wherein the scheduler is configured to automatically assign the test times to the plurality of tester software environments in a manner that exclusively assigns the automatic test equipment for a duration of a respective test time to one of the tester software environments before the scheduler acquires test instructions and based on demand for the automatic test equipment from the tester software environments,
   to acquire the test instructions from a tester software environment of the plurality of tester software environments to which a current test time is assigned,
   to control the automatic test equipment to perform a test according to the test instructions to acquire test results, and
   to provide the test results to the tester software environment of the plurality of tester software environments to which the current test time is assigned, and wherein the scheduler is further configured to set the automatic test equipment to an initial state before and/or after performing the test.

2. The apparatus of claim 1, wherein the scheduler is operable to run on a central computer that is operable to control the automatic test equipment.

3. The apparatus of claim 2, wherein a respective tester software environment of the plurality of tester software environments is operable to run on a respective computer of a plurality of computers connected to the central computer.

4. The apparatus of claim 2, wherein the plurality of tester software environments are operable to run on the central computer as virtual machines.

5. The apparatus of claim 1, wherein the scheduler is further configured to automatically assign the test times to the plurality of tester software environments using a first-come first-serve principle.

6. The apparatus of claim 1, wherein the test instructions comprise a tester program and/or a tester configuration.

7. The apparatus of claim 1, wherein a respective control unit is associated with a respective tester software environment of the plurality of tester software environments, and wherein the respective control unit is configured to request a test time from the scheduler.

8. A system, comprising:
   an automatic test equipment;
   a central computer operable to control the automatic test equipment to perform a test according to test instructions to acquire test results, wherein the central computer includes a scheduler operable to run on the central computer, operable to schedule test times on the automatic test equipment for a plurality of tester software environments, wherein the scheduler is configured to automatically assign the test times to the plurality of tester software environments in a manner that exclusively assigns the automatic test equipment for a duration of a respective test time to one of the tester software environments before the scheduler acquires the test instructions and based on demand for the automatic test equipment from the tester software environments, to acquire the test instructions from a tester software environment of the plurality of tester software environments to which a current test time is assigned, and to provide the test results to the tester software environment of the plurality of tester software environments to which the current test time is assigned, and wherein the scheduler is further operable to set the automatic test equipment to an initial state before and/or after performing the test; and
   a plurality of computers, wherein a respective tester software environment of the plurality of tester software environments is operable to run on a respective computer of the plurality of computers.

9. A system, comprising:
   an automatic test equipment; and
   a central computer operable to control the automatic test equipment to perform a test according to test instructions to acquire test results, wherein the central computer includes a scheduler operable to run on the central computer, operable to schedule test times on the automatic test equipment for a plurality of tester software environments, wherein the scheduler is configured to automatically assign the test times to the plurality of tester software environments in a manner that exclusively assigns the automatic test equipment for a duration of a respective test time to one of the tester software environments before the scheduler acquires the test instructions and based on demand for the automatic test equipment from the tester software environments, to acquire the test instructions from a tester software environment of the plurality of tester software environments to which a current test time is assigned, and to provide the test results to the tester software environment of the plurality of tester software environments to which the current test time is assigned, wherein the scheduler is further configured to set the automatic test equipment to an initial state before and/or after performing the test, and wherein the plurality of tester software environments are operable to run on the central computer as virtual machines.

10. A method of scheduling test times on an automatic test equipment for a plurality of tester software environments, the method comprising:

automatically assigning the test times to the plurality of tester software environments in a manner that exclusively assigns the automatic test equipment for a duration of a respective test time to one of the tester software environments before the scheduler acquires test instructions and based on demand for the automatic test equipment from the tester software environments;

acquiring the test instructions from a tester software environment of the plurality of tester software environments to which a current test time is assigned;

controlling the automatic test equipment to perform a test according to the test instructions to acquire test results;

providing the test results to the tester software environment of the plurality of tester software environments to which the current test time is assigned; and setting the automatic test equipment to an initial state before and/or after performing the test.

11. A non-transitory digital storage medium having a computer program stored thereon to perform a method of scheduling test times on an automatic test equipment for a plurality of tester software environments, the method comprising:

automatically assigning the test times to the plurality of tester software environments in a manner that exclusively assigns the automatic test equipment for a duration of a respective test time to one of the tester software environments before the scheduler acquires test instructions and based on demand for the automatic test equipment from the tester software environments;

acquiring the test instructions from a tester software environment of the plurality of tester software environments to which a current test time is assigned;

controlling the automatic test equipment to perform a test according to the test instructions to acquire test results;

providing the test results to the tester software environment of the plurality of tester software environments to which the current test time is assigned; and setting the automatic test equipment to an initial state before and/or after performing the test.

* * * * *